(12) United States Patent
Meinel et al.

(10) Patent No.: US 8,546,903 B2
(45) Date of Patent: Oct. 1, 2013

(54) IONIC ISOLATION RING

(75) Inventors: Walter Meinel, Tucson, AZ (US); Kalin V. Lazarov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/900,139

(22) Filed: Oct. 7, 2010

(65) Prior Publication Data
US 2012/0086098 A1  Apr. 12, 2012

(51) Int. Cl.
*H01L 31/058* (2006.01)

(52) U.S. Cl.
USPC ........... 257/467; 257/701; 257/704; 257/691; 438/456; 438/55

(58) Field of Classification Search
USPC ................. 257/704, 691, 701, 467; 438/456, 438/55
See application file for complete search history.

(56) References Cited

U.S. PATENT DOCUMENTS

| | | | | |
|---|---|---|---|---|
| 6,137,161 A * | 10/2000 | Gilliland et al. | ............. | 257/678 |
| 6,148,888 A * | 11/2000 | Loureiro Benimeli | ....... | 152/415 |
| 7,154,047 B2 * | 12/2006 | Howard | ........................ | 174/260 |
| 7,291,513 B2 * | 11/2007 | Ouellet et al. | .................. | 438/64 |
| 7,298,030 B2 * | 11/2007 | McWilliams et al. | ........ | 257/680 |
| 7,417,206 B2 * | 8/2008 | Nakamura | ................. | 219/444.1 |
| 7,671,515 B2 * | 3/2010 | Metz et al. | .................... | 310/340 |
| 7,750,462 B1 * | 7/2010 | Cohn et al. | ..................... | 257/704 |
| 8,195,308 B2 * | 6/2012 | Frank et al. | .................... | 607/122 |
| 2002/0096421 A1 * | 7/2002 | Cohn et al. | .................... | 200/181 |
| 2003/0019840 A1 * | 1/2003 | Smith et al. | ..................... | 216/60 |
| 2004/0086423 A1 * | 5/2004 | Wohlstadter et al. | ........... | 422/52 |
| 2005/0142685 A1 * | 6/2005 | Ouellet et al. | .................. | 438/51 |
| 2005/0248025 A1 * | 11/2005 | Tsai et al. | ..................... | 257/691 |
| 2006/0157841 A1 * | 7/2006 | Minervini | ..................... | 257/680 |
| 2007/0042527 A1 * | 2/2007 | Tuckerman et al. | .......... | 438/106 |
| 2007/0201715 A1 * | 8/2007 | Minervini | .................... | 381/355 |
| 2008/0032457 A1 * | 2/2008 | McWilliams et al. | ........ | 438/125 |
| 2008/0122020 A1 * | 5/2008 | Metz et al. | .................... | 257/415 |
| 2008/0296717 A1 * | 12/2008 | Beroz et al. | .................... | 257/434 |
| 2009/0102030 A1 * | 4/2009 | Khan et al. | .................... | 257/675 |
| 2009/0212407 A1 * | 8/2009 | Foster et al. | .................. | 257/686 |
| 2009/0294897 A1 * | 12/2009 | Lee et al. | ...................... | 257/509 |
| 2010/0038733 A1 * | 2/2010 | Minervini | ..................... | 257/416 |
| 2010/0044850 A1 * | 2/2010 | Lin et al. | ....................... | 257/690 |
| 2010/0139389 A1 * | 6/2010 | Morita et al. | .............. | 73/204.11 |
| 2011/0156218 A1 * | 6/2011 | Tsai | .............................. | 257/620 |
| 2012/0080764 A1 * | 4/2012 | Xue | ................................ | 257/417 |
| 2012/0139077 A1 * | 6/2012 | Meinel et al. | ................. | 257/467 |

FOREIGN PATENT DOCUMENTS
WO   WO2010070704   6/2010

* cited by examiner

*Primary Examiner* — Fernando L Toledo
*Assistant Examiner* — Mohammed Shamsuzzaman
(74) *Attorney, Agent, or Firm* — Alan A. R. Cooper; W. James Brady, III; Frederick J. Telecky, Jr.

(57) ABSTRACT

There has been very little (if any) attention to address contamination diffusion within an integrated circuit (IC) because there are very few applications where a protective overcoat will be penetrated as part of the manufacturing process. Here, a sealing ring is provided that address this problem. Preferably, the sealing ring uses the combination of electrically conductive barrier rings and the tortuous migration path to allow an electronic device (i.e., thermopile), where a protective overcoat is penetrated during manufacture, to communicate with external devices while being isolated to prevent contamination.

17 Claims, 13 Drawing Sheets

IONIC ISOLATION RING

TECHNICAL FIELD

The invention relates generally to an isolation or sealing ring and, more particularly, to a sealing ring used for an electronic device having an opening formed in a protective overcoat.

BACKGROUND

Sealing rings generally are employed along the periphery of an integrated circuit (IC). A reason is that when the ICs are cut away from the wafers (upon with the IC are manufactured) the saw will penetrate or cut through a protective overcoat. Penetrating the protective overcoat of an IC can allow contaminants to diffuse into the active areas of the IC. However, there has been very little (if any) attention to address contamination diffusion within an IC because there are very few applications where a protective overcoat will be penetrated as part of the manufacturing process. As a result there is a need for a method and or apparatus for reducing diffusion of contaminants within an IC when the protective overcoat has been penetrated as part of the manufacturing process.

Some conventional methods and apparatuses are: U.S. Patent Pre-Grant Publ. No. 2009/0294897; U.S. Patent Pre-Grant Publ. No. 2005/0248025; and PCT Publ. No. WO2010070704.

SUMMARY

A preferred embodiment of the present invention, accordingly, provides an apparatus. The apparatus comprises an electronic device having an opening formed in a protective overcoat so as to etch a cavity in a substrate; and a sealing ring formed along the periphery of the electronic device, wherein the seal ring includes: a first barrier ring having a first set of electrically conductive layers formed between the substrate and the protective overcoat, wherein the first barrier ring includes a first opening at a first position; a second barrier ring having a second set of electrically conductive layers formed between the substrate and the protective overcoat, wherein the second barrier ring includes a second opening at a second position, wherein the second barrier ring is generally parallel to the first barrier ring so as to form a cavity region therebetween, and wherein the first and second opening are separated from one another; and a circuit trace that is formed in the cavity region, wherein the circuit trace extends through the first opening so as to be electrically connected to the electronic device, and wherein the circuit trace extends through the second opening.

In accordance with a preferred embodiment of the present invention, the first and second sets of electrically conductive layers further comprise: a first metallization layer that forms at least one of the electrically conductive layers from the first set and at least one of the electrically conductive layers from the second set and that extend through the cavity region; and a second metallization layer that forms at least one of the electrically conductive layers from the first set and at least one of the electrically conductive layers from the second set and that extend through the cavity region, wherein the circuit trace is located between the first and second metallization layers.

In accordance with a preferred embodiment of the present invention, the circuit trace further comprises a plurality of circuit traces that each extent through the first and second openings.

In accordance with a preferred embodiment of the present invention, the first and second sets of electrically conductive layers each further comprise a first via layer that is formed between the substrate and the first metallization layer.

In accordance with a preferred embodiment of the present invention, the first and second sets of electrically conductive layers each further comprise a second via layer that is formed over the first metallization layer.

In accordance with a preferred embodiment of the present invention, the first and second sets of electrically conductive layers each further comprise a third metallization layer that is formed over the second via layer and that is generally parallel to the first circuit trace.

In accordance with a preferred embodiment of the present invention, the first and second sets of electrically conductive layers each further comprise a third via layer that is formed over the third metallization layer.

In accordance with a preferred embodiment of the present invention, the first and second sets of electrically conductive layers each further comprise a fourth metallization layer that is formed over the third via layer and that is generally parallel to the second circuit trace.

In accordance with a preferred embodiment of the present invention, the first and second sets of electrically conductive layers each further comprise a fourth via layer that is formed between the second and fourth metallization layers.

In accordance with a preferred embodiment of the present invention, the electronic device further comprises a thermopile.

In accordance with a preferred embodiment of the present invention, an apparatus is provided. The apparatus comprises a functional circuitry; a thermopile having an opening formed in a protective overcoat so as to etch a cavity in a substrate; and a sealing ring formed along the periphery of the electronic device, wherein the seal ring includes: a first barrier ring having a first set of electrically conductive layers formed between the substrate and the protective overcoat, wherein the first barrier ring includes a first opening at a first position; a second barrier ring having a second set of electrically conductive layers formed between the substrate and the protective overcoat, wherein the second barrier ring includes a second opening at a second position, wherein the second barrier ring is generally parallel to the first barrier ring so as to form a cavity region therebetween, and wherein the first and second opening are separated from one another; and a circuit trace that is formed in the cavity region, wherein the circuit trace extends through the first opening so as to be electrically connected to the thermopile, and wherein the circuit trace extends through the second opening to be electrically connected to the functional circuitry.

In accordance with a preferred embodiment of the present invention, the first and second sets of electrically conductive layers each further comprise: a first via layer that is formed between the substrate and the first metallization layer; a second via layer that is formed over the first metallization layer; a third metallization layer that is formed over the second via layer and that is generally parallel to the first circuit trace; a third via layer that is formed over the third metallization layer; a fourth metallization layer that is formed over the third via layer and that is generally parallel to the second circuit trace; and a fourth via layer that is formed between the second and fourth metallization layers.

In accordance with a preferred embodiment of the present invention, an apparatus is provided. The apparatus comprises a thermopile having an opening formed in a protective overcoat so as to etch a cavity in a substrate; and a sealing ring formed along the periphery of the electronic device, wherein the seal ring includes: a first inner via layer formed over the substrate; a first outer via layer formed over the substrate, wherein the first outer via layer is generally parallel to the first inner via layer; a first metallization layer that is formed over the first inner and first outer via layers; a second inner via layer formed over the first metallization layer, wherein the second inner via layer is generally aligned with the first inner via layer; a second outer via layer formed over the first metallization layer, wherein the second outer via layer is generally aligned with the first output via layer; a second metallization layer having an inner portion and an outer portion, wherein the inner portion of the second metallization layer is generally aligned with the second inner via layer, and wherein the outer portion of the second metallization layer is generally aligned with the second outer via layer, and wherein the inner portion of the second metallization layer includes a first opening at a first position, and wherein the outer portion of the second metallization layer includes a second opening at a second portion, and wherein the first and second positions are separated from one another; a first circuit trace formed between the inner and outer portions of the second metallization layer, wherein the first circuit trace extends through the first opening so as to be electrically connected with the thermopile, and wherein the first circuit trace extends through the second opening; a third inner via layer formed over the inner portion of the second metallization layer; a third outer via layer formed over the outer portion of the second metallization layer; a third metallization layer having an inner portion and an outer portion, wherein the inner portion of the third metallization layer is generally aligned with the third inner via layer, and wherein the outer portion of the third metallization layer is generally aligned with the third outer via layer, and wherein the inner portion of the third metallization layer includes a third opening at a third position, and wherein the outer portion of the third metallization layer includes a fourth opening at a fourth portion, and wherein the third and fourth positions are separated from one another; a second circuit trace formed between the inner and outer portions of the third metallization layer, wherein the second circuit trace extends through the third opening so as to be electrically connected with the thermopile, and wherein the second circuit trace extends through the fourth opening; a fourth inner via layer formed over the inner portion of the third metallization layer; a fourth outer via layer formed over the outer portion of the third metallization layer; and a fourth metallization layer that is formed over the fourth inner and fourth outer via layers.

In accordance with a preferred embodiment of the present invention, the first and second positions are located opposite one another along the periphery of the thermopile.

In accordance with a preferred embodiment of the present invention, the first opening is generally aligned with the third opening, and wherein the second opening is generally aligned with the fourth opening.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
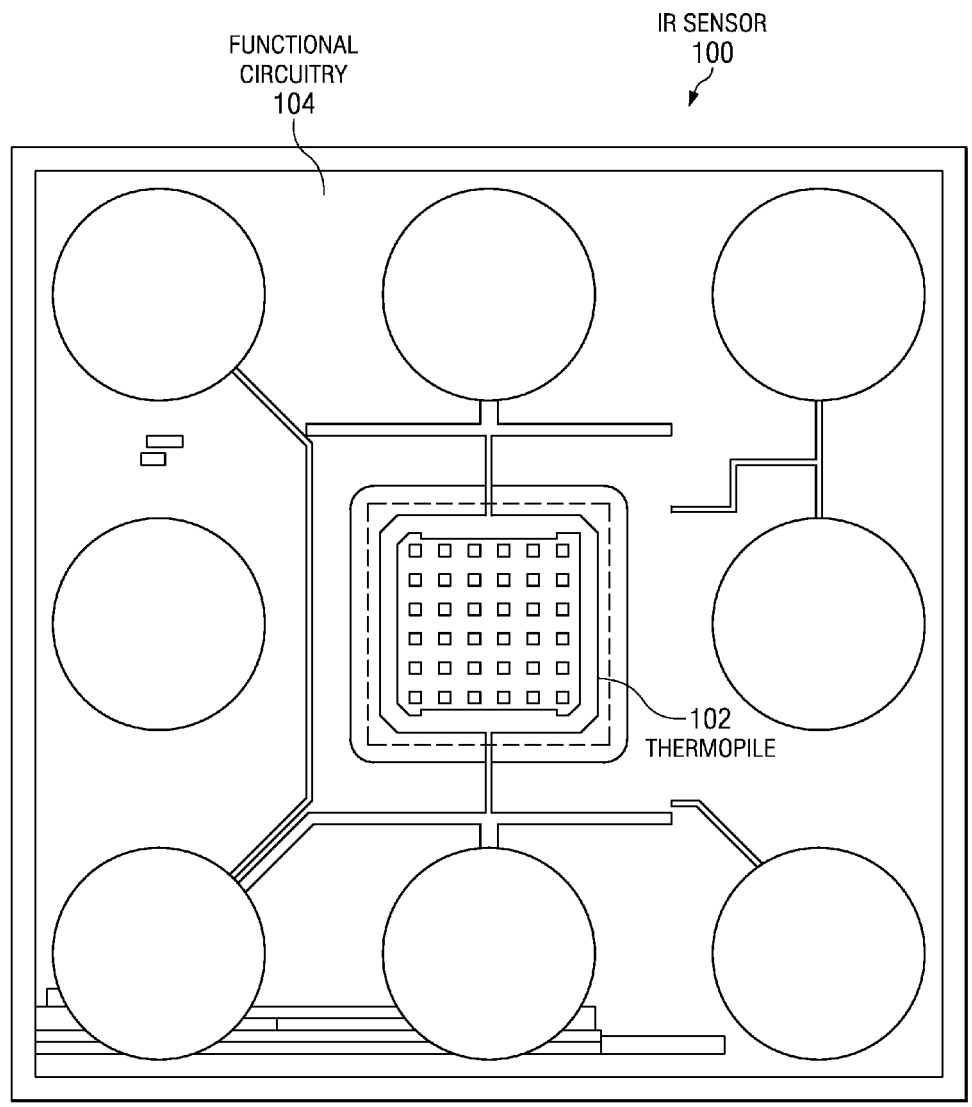
FIG. 1A is a plan view of the layout of an example of an infrared (IR) sensor in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1A of the drawings, the reference numeral 100 generally designates an example of an IR sensor in accordance with a preferred embodiment of the present invention. The IR sensor 100 generally comprises a thermopile 102 and functional circuitry 104 (which may be, for example, an analog-to-digital converter or ADC). The thermopile 102 may be formed on the same die as the functional circuitry 104, and the thermopile 102 is in electrical contact with functional circuitry 104.

Figure 1B:
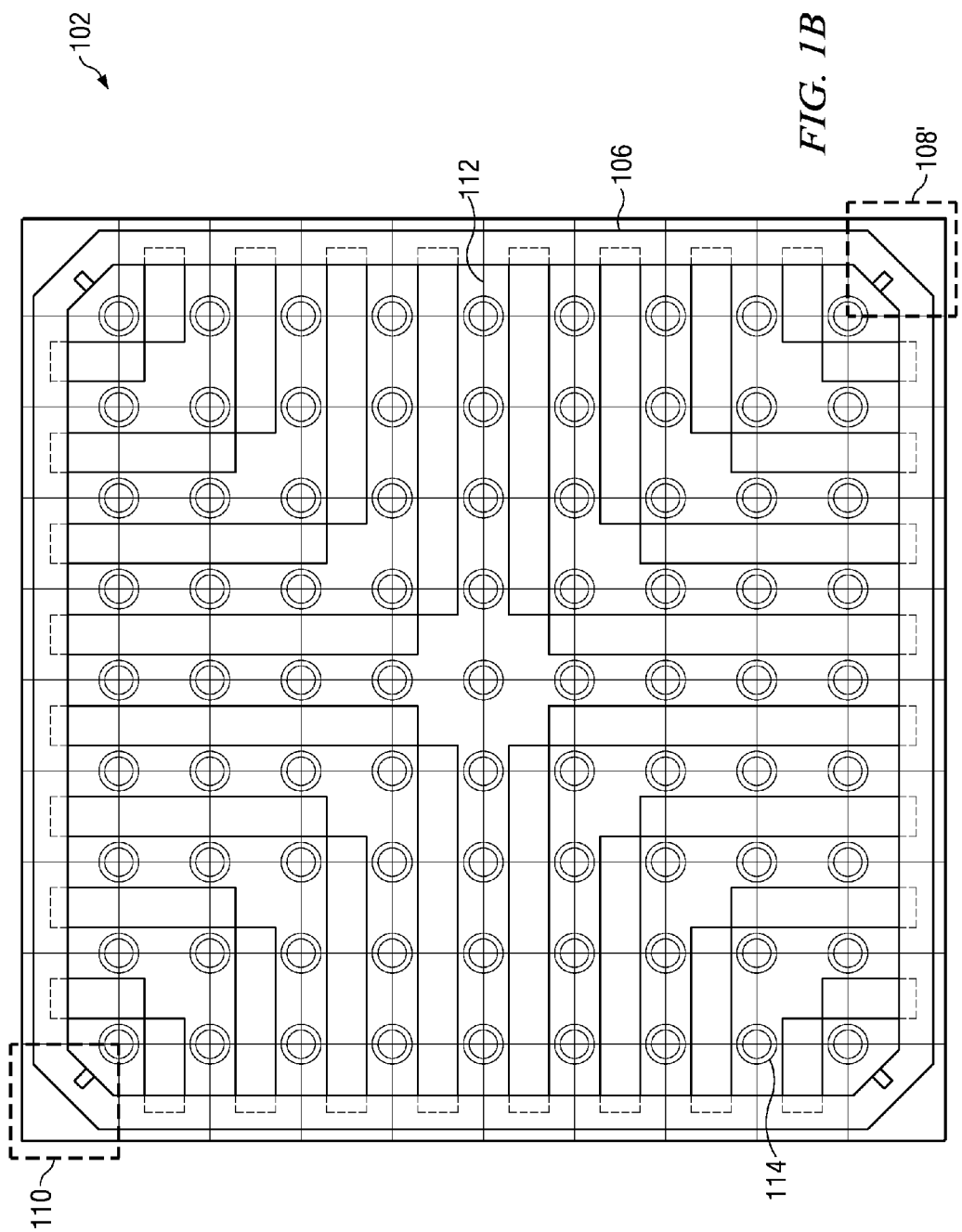
FIG. 1B is a plan view of the layout of the thermopiles of FIG. 1A.
Figure 2A:
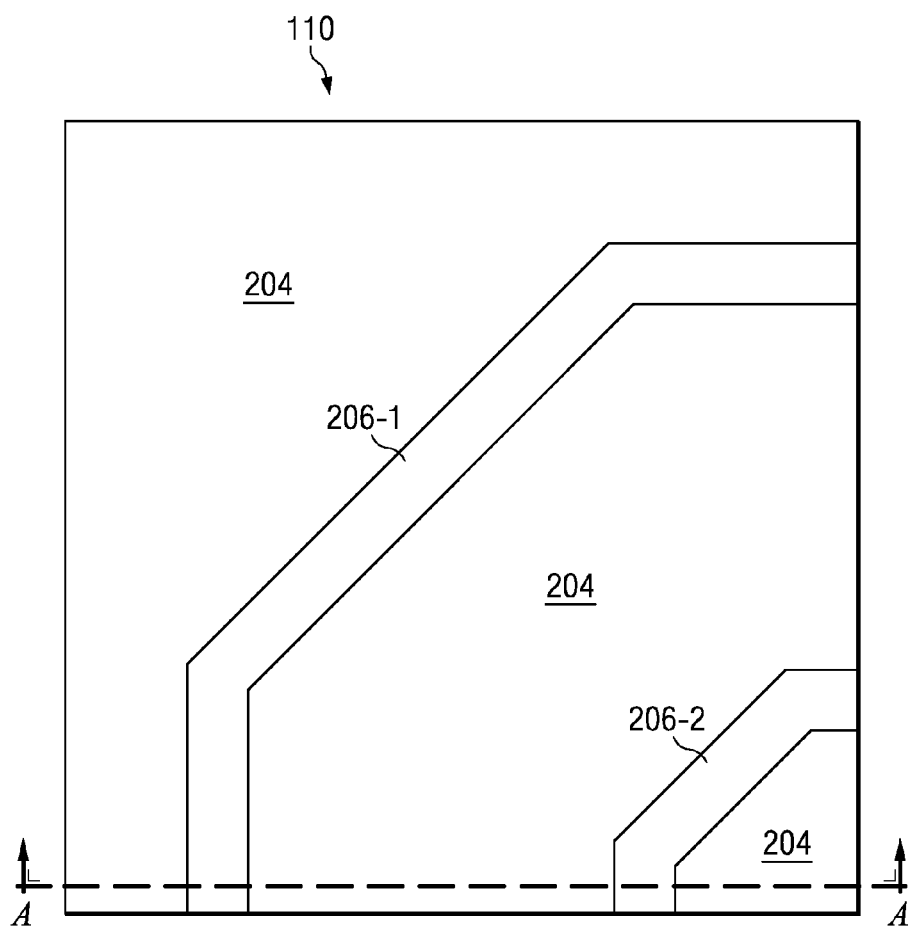
FIG. 2A is plan view of the formation of inner and outer via layers for a corner of the thermopile of FIG. 1B.
Figure 2B:
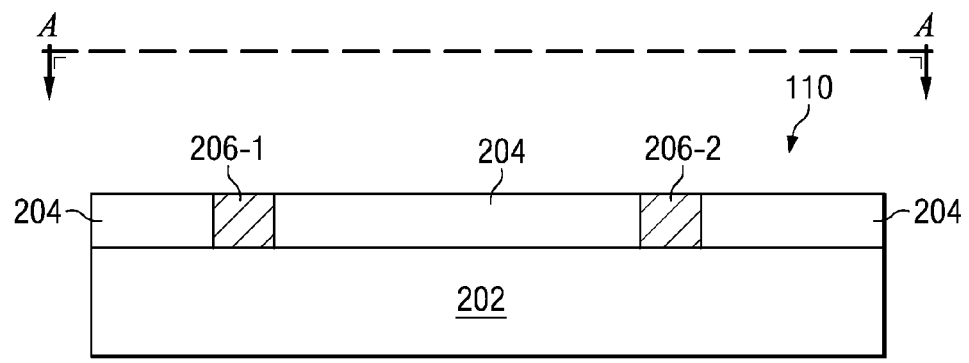
FIG. 2B is a cross-sectional view of FIG. 2A along section line I-I.
Figure 3A:
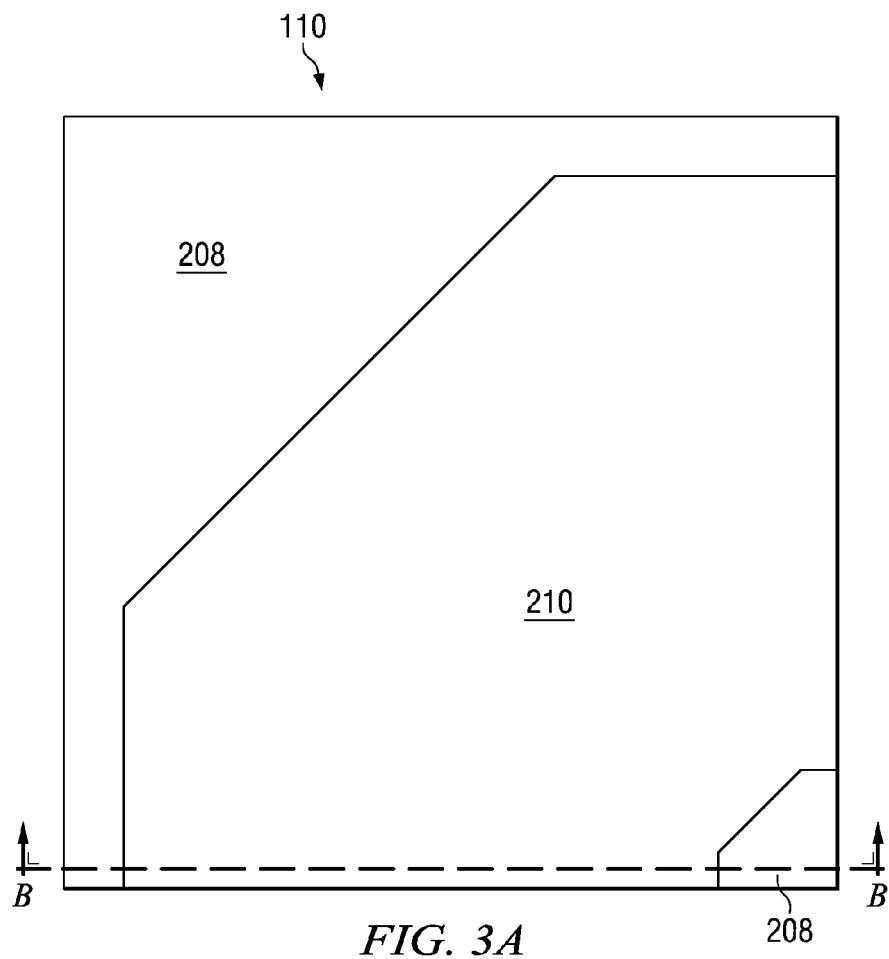
FIG. 3A is plan view of the formation of a metallization layer for a corner of the thermopile of FIG. 1B.
Figure 3B:
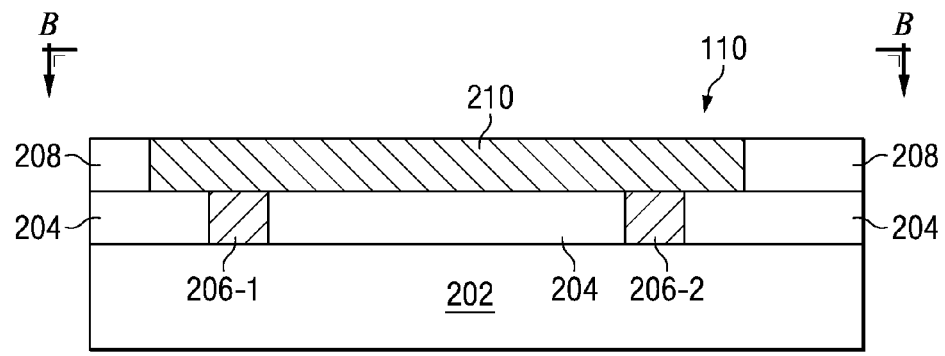
FIG. 3B is a cross-sectional view of FIG. 3A along section line II-II.
Figure 4A:
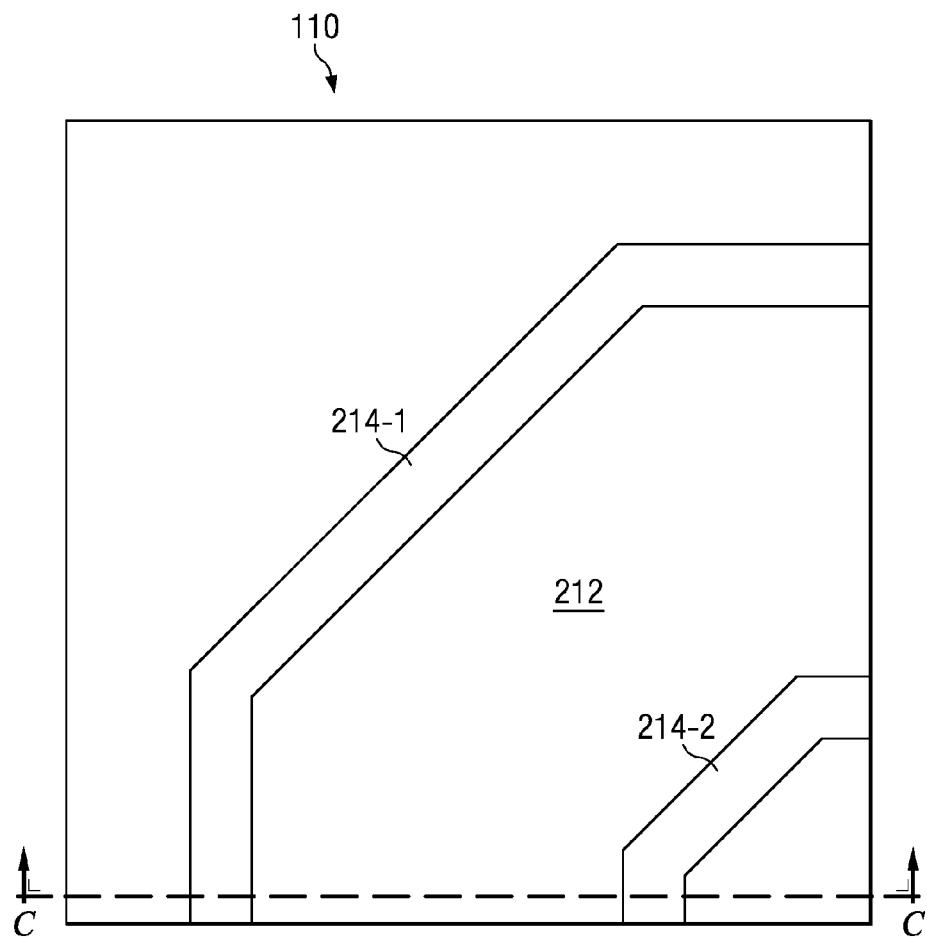
FIG. 4A is plan view of the formation of inner and outer via layers for a corner of the thermopile of FIG. 1B.
Figure 4B:
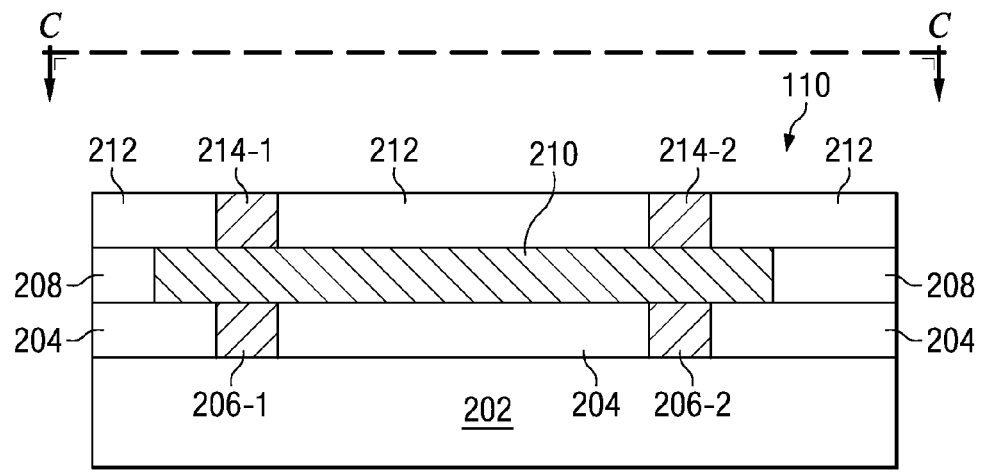
FIG. 4B is a cross-sectional view of FIG. 4A along section line III-III.
Figure 5A:
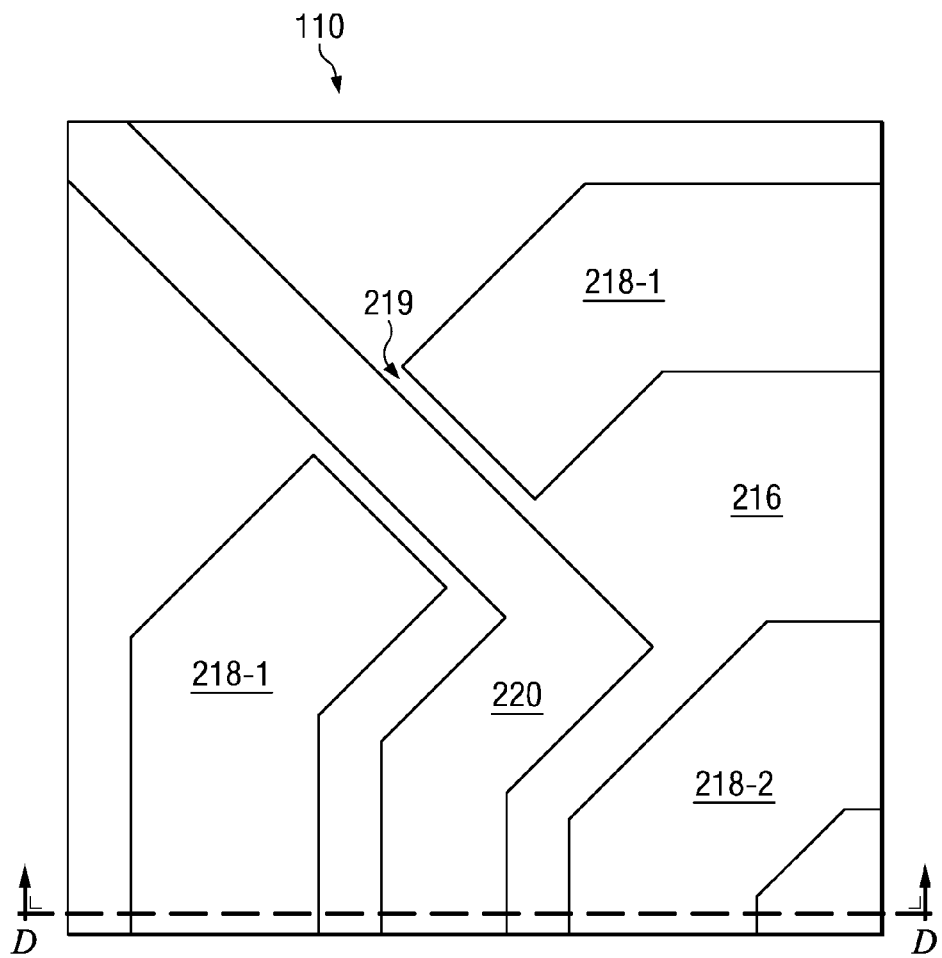
FIG. 5A is plan view of the formation of metallization layers and a circuit trace for a corner of the thermopile of FIG. 1B.
Figure 5B:
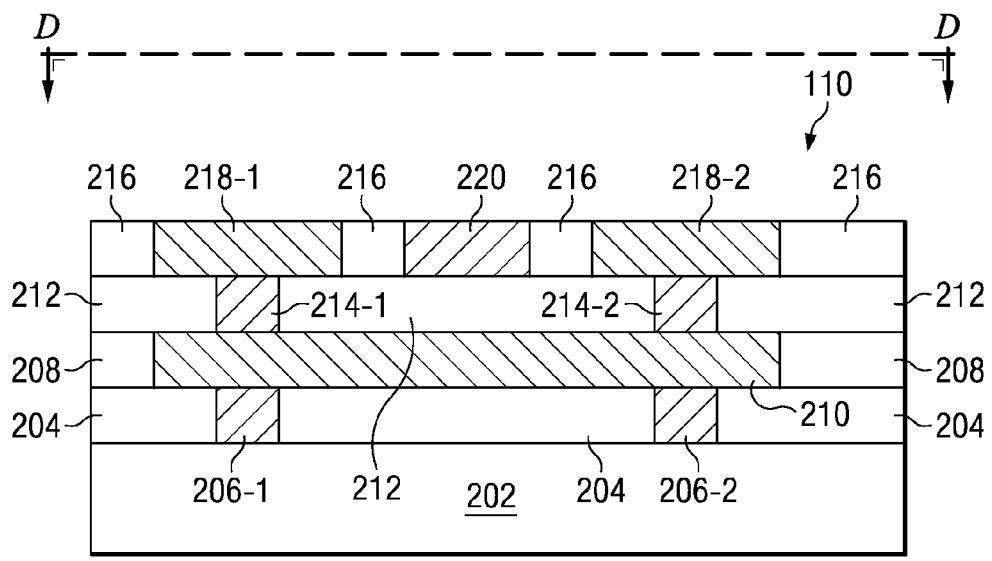
FIG. 5B is a cross-sectional view of FIG. 5A along section line IV-IV.
Figure 5C:
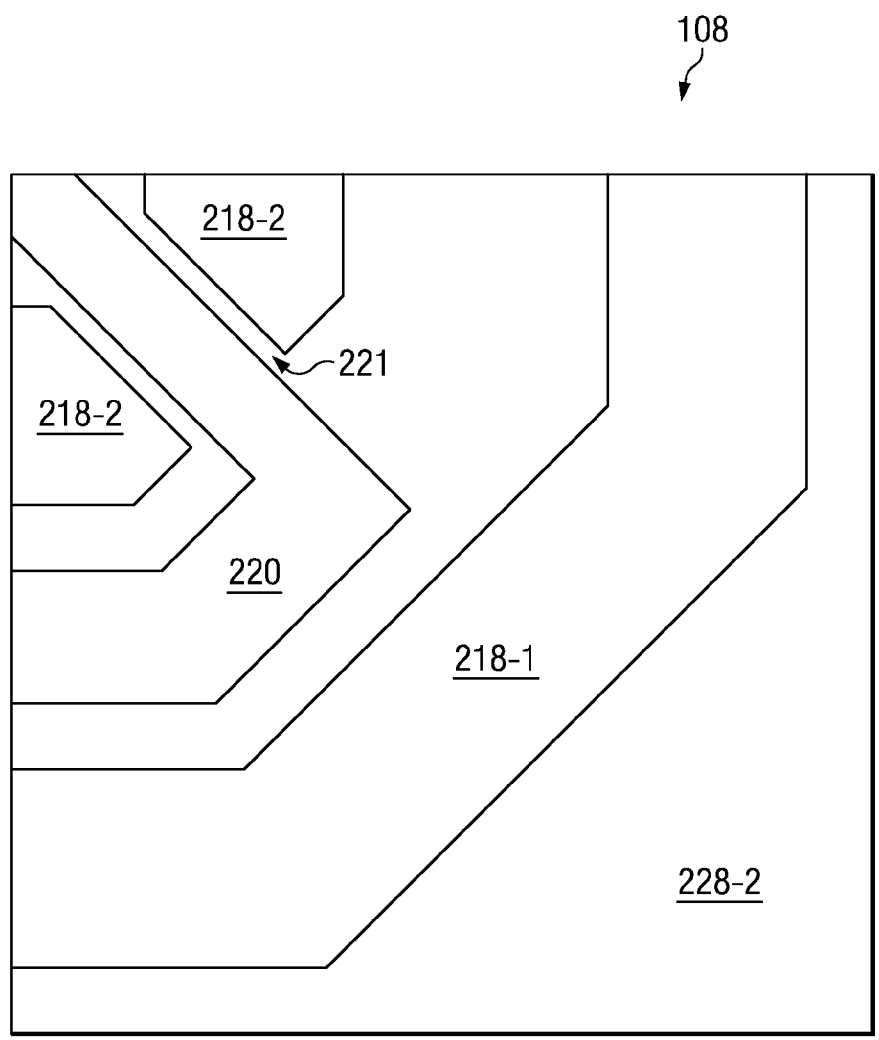
FIG. 5C is a plan view of the formation of metallization layers and a circuit trace for an opposite corner of the thermopile of FIG. 1B.
Figure 6A:
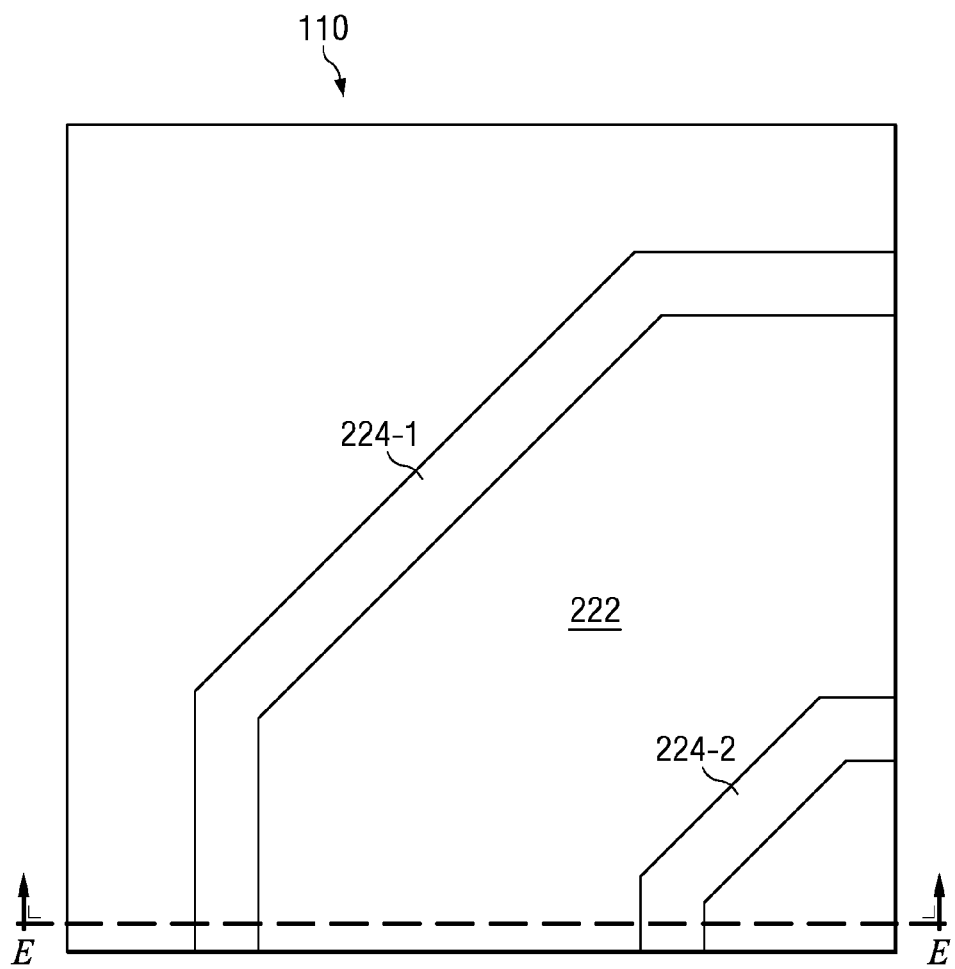
FIG. 6A is plan view of the formation of inner and outer via layers for a corner of the thermopile of FIG. 1B.
Figure 6B:
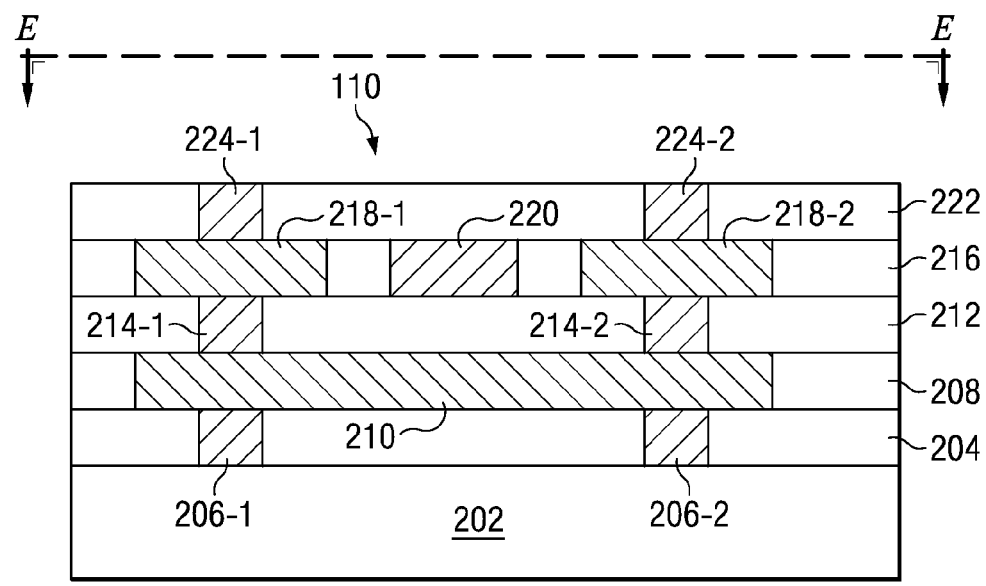
FIG. 6B is a cross-sectional view of FIG. 6A along section line V-V.
Figure 7A:
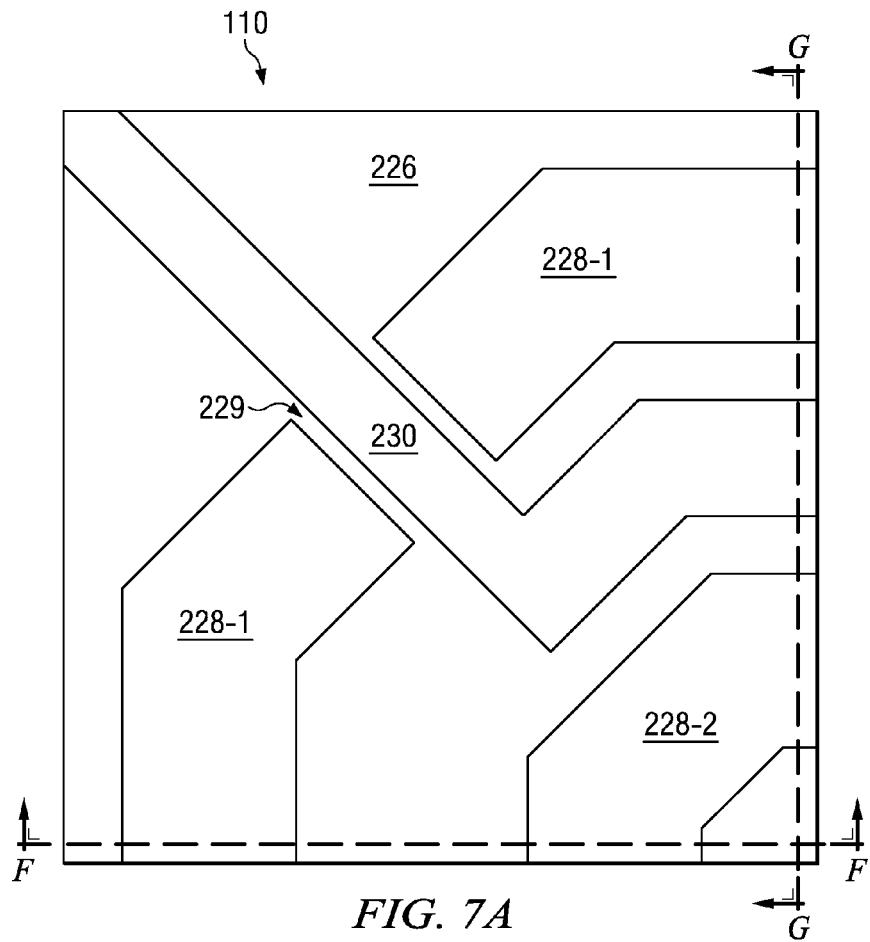
FIG. 7A is plan view of the formation of metallization layers and a circuit trace for a corner of the thermopile of FIG. 1B.
Figure 7B:
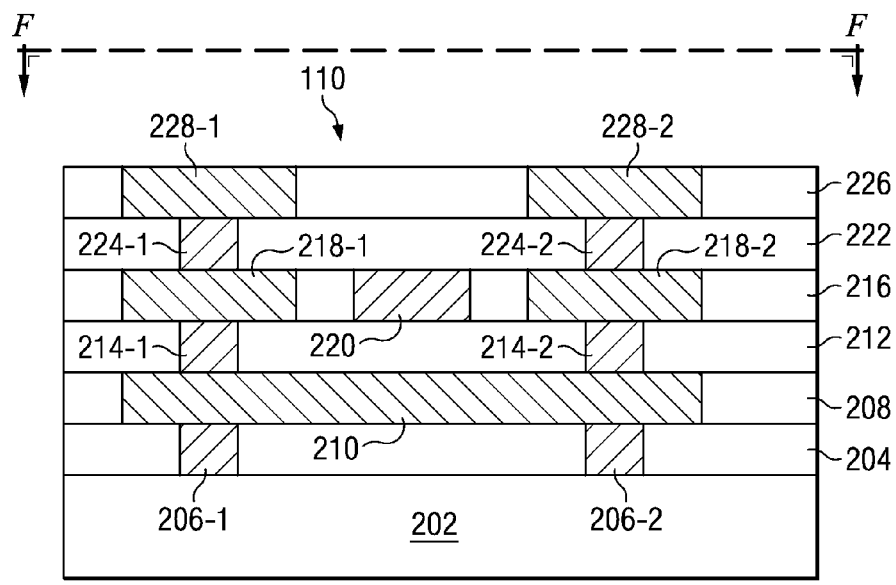
FIG. 7B is a cross-sectional view of FIG. 7A along section line VI-VI.
Figure 7C:
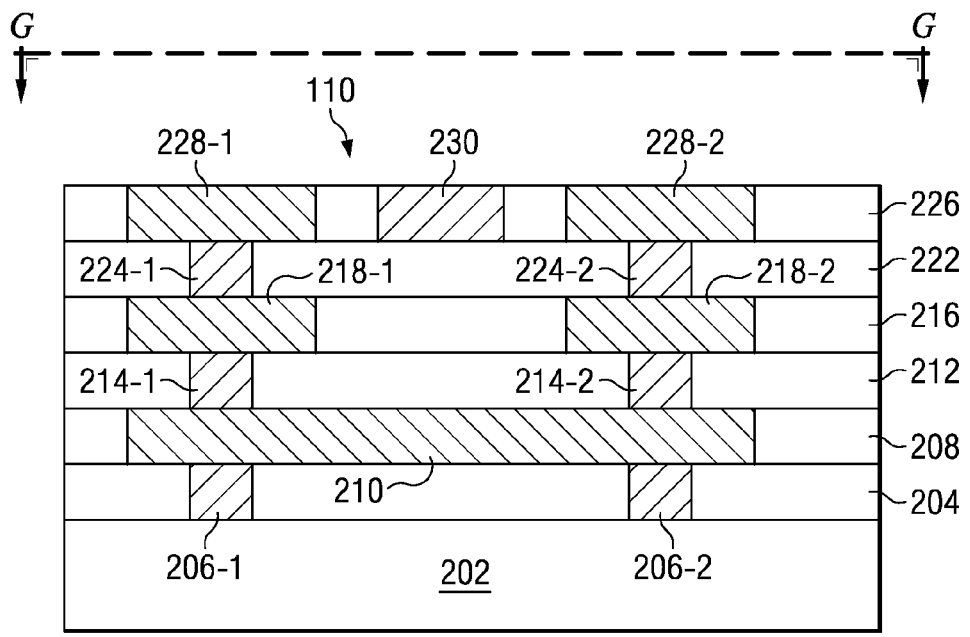
FIG. 7C is a cross-sectional view of FIG. 7A along section line VII-VII.
Figure 7D:
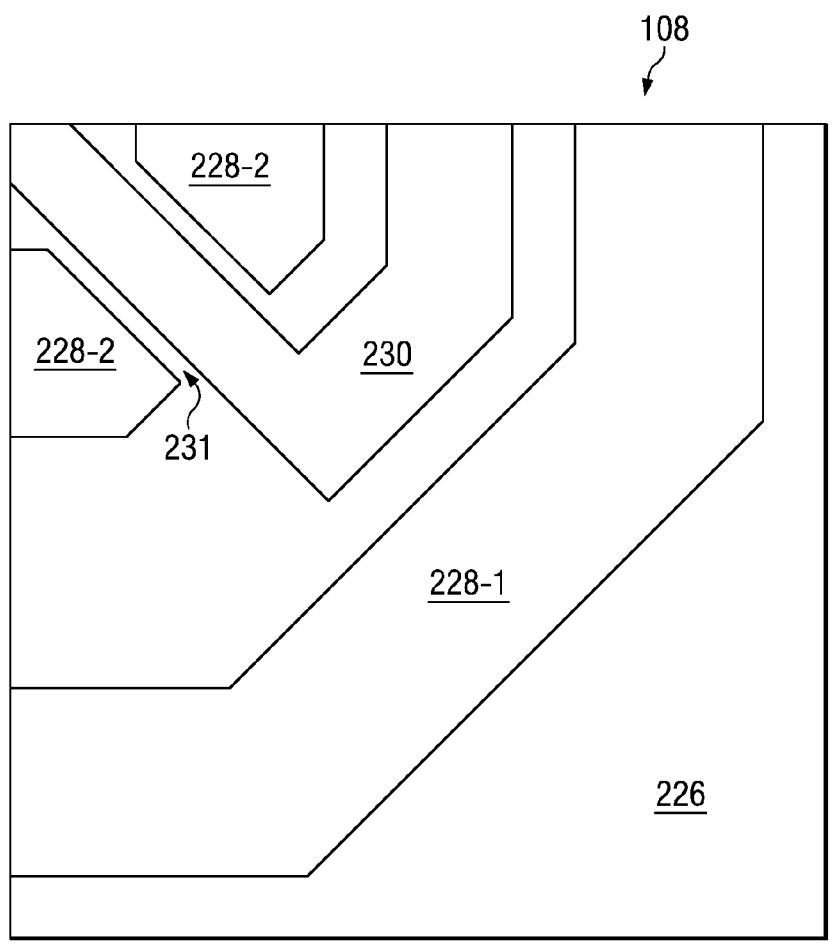
FIG. 7D is a plan view of the formation of metallization layers and a circuit trace for an opposite corner of the thermopile of FIG. 1B.
Figure 8A:
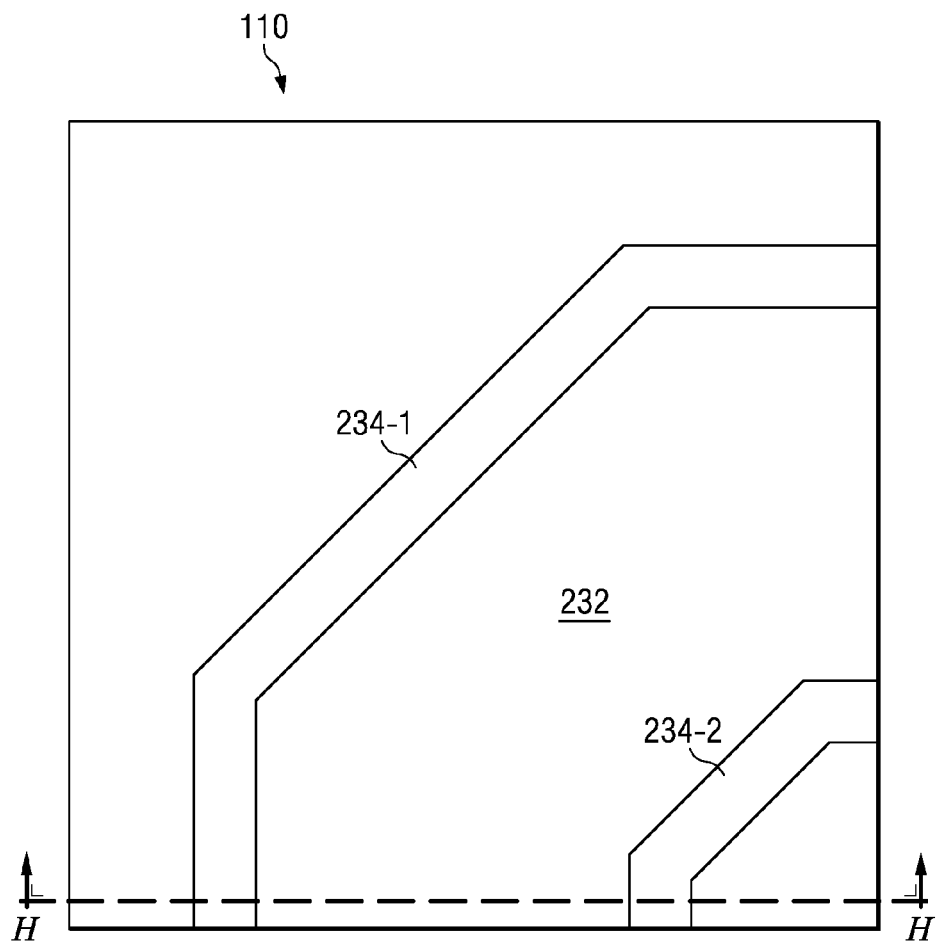
FIG. 8A is plan view of the formation of inner and outer via layers for a corner of the thermopile of FIG. 1B.
Figure 8B:
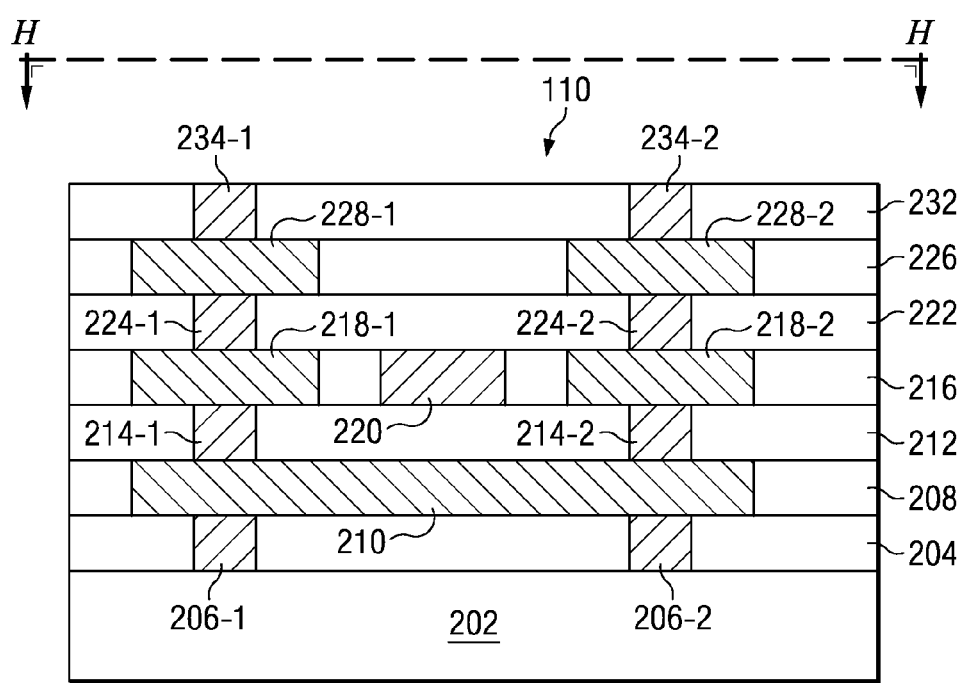
FIG. 8B is a cross-sectional view of FIG. 8A along section line VIII-VIII.
Figure 9A:
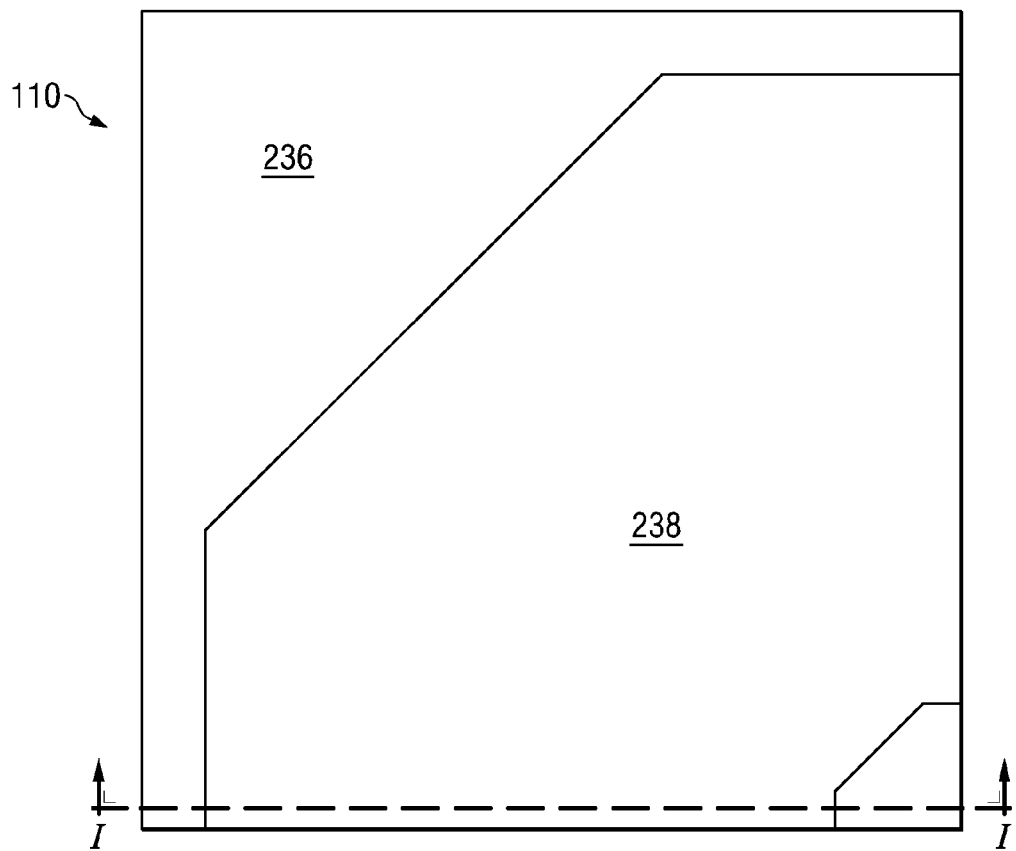
FIG. 9A is plan view of the metallization layer for a corner of the thermopile of FIG. 1B.
Figure 9B:
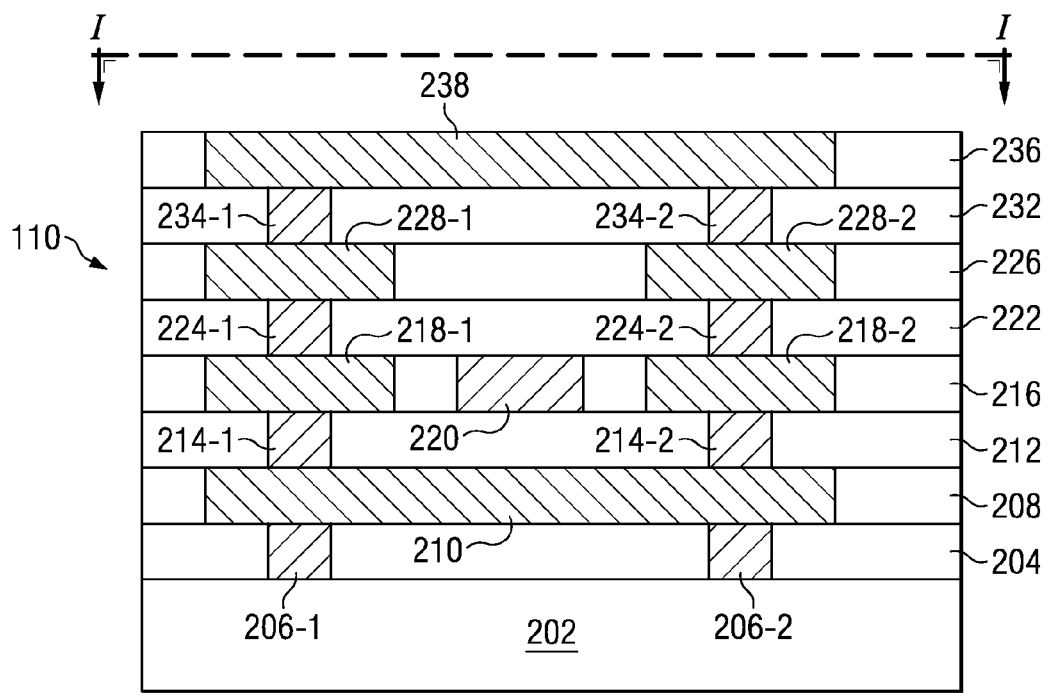
FIG. 9B is a cross-sectional view of FIG. 9A along section line IX-IX.
Figure 10:
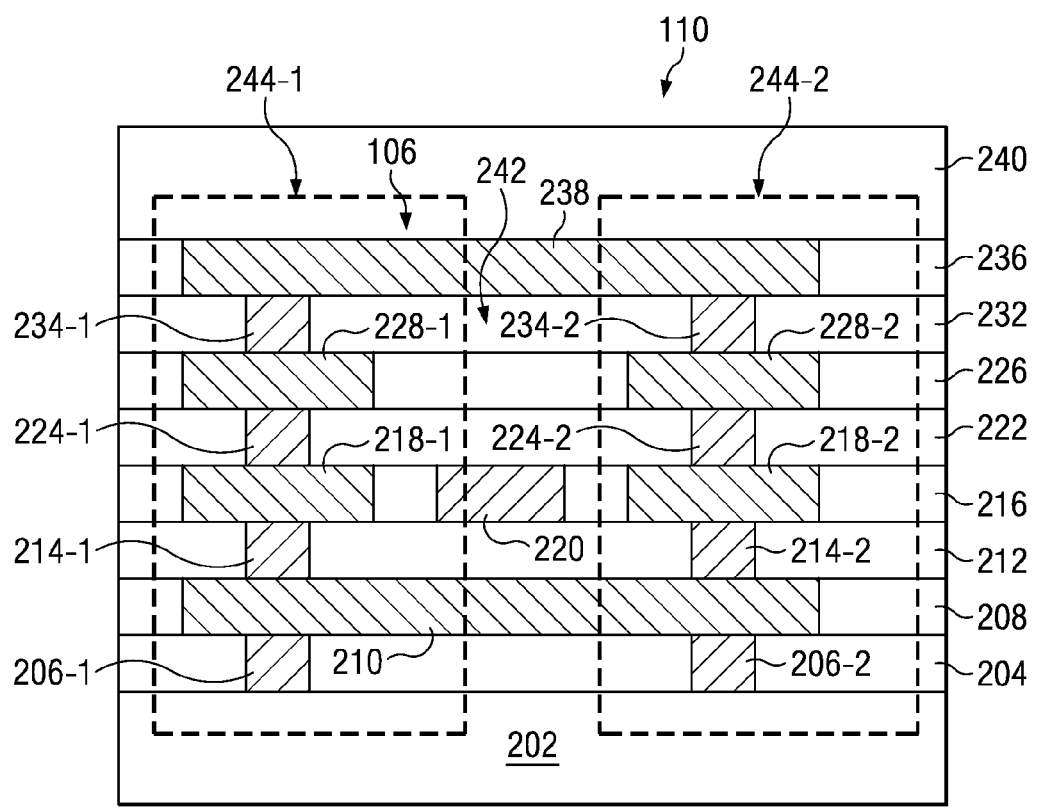
FIG. 10 is a cross sectional view of the sealing ring for a corner of the thermopile of FIG. 1B.

Turning to FIG. 1B, thermopile 102 can be seen in greater detail. This thermopile 102 generally comprises functional area 112 that employs the Peltier effect to generate an electrical current based on a temperature difference between "cold" and "hot" junctions. As part of the formation of the thermopile 102, openings or holes (i.e., 114) are formed in the functional area 112 that penetrate a protective overcoat (which is generally a dielectric stack) and extends down to the substrate. This allows the substrate underneath most of the functional area 112 to be etched. The recesses formed in the substrate from the etching process help to form "hot" junctions in the center of the functional area 112, and "cold" junctions along the periphery of the functional area 112.

Because the protective overcoat is penetrated as part of the manufacturing process for the thermopile 102, diffusion of contaminants into the functional circuitry (within functional area 112) can become an issue. To generally isolate the functional area 112, a sealing ring 106 is formed along the periphery of the functional area 112 of thermopile 102. However, because a communication channel is needed between the functional area 112 (which is generally isolated by the sealing ring 106), circuit traces (not shown) are formed within the sealing ring 106. To reduce diffusion along the circuit traces (not shown), the openings for the circuit traces (not shown) in the sealing ring 106 are misaligned or separated from one another. Preferably, the circuit traces (not shown) can enter the sealing ring 106 at corner 108 and exit the sealing ring 106 at corner 110. This misalignment or separation generally forces contaminants to migrate for long distances to reach the functional circuitry (within functional area 112).

Turning now to FIGS. 2A to 10, formation of the sealing ring 106 can be seen. Typically, the sealing ring 106 is formed at substantially the same time as the functional area 112. The sealing ring 106 is generally comprised of an inner barrier ring 244-2 and an outer barrier ring 244-1, where each is formed of a set or stack of electrically conductive layers over substrate 202. These barrier rings 244-1 and 244-2 are generally parallel to one another along the periphery of functional area 112 with a cavity region 242 therebetween. The cavity region is generally comprised of a set or stack of dielectric layers (i.e., silicon dioxide), which includes layers 206, 208, 212, 216, 222, 226, 232 and 236. The stacks of electrically conductive layers forming barrier rings 244-1 and 244-2 generally include inner via layers 206-2, 214-2, 224-2, and 234-2 (which are generally aligned with one another) and outer via layers 206-1, 214-1, 224-2, and 234-1 (which are generally aligned with one another) that are generally continuous strips of conductive materials (i.e., copper, aluminum, tungsten, etc.). Included between the via layers 206-1, 206-2, 214-1, 214-2, 224-2, 224-2, 234-2 and 234-2, are inner metallization layers 218-2 and 228-2 (which are generally aligned with the inner via layers 206-2, 214-2, 224-2, and 234-2) and outer metallization layers 218-1 and 228-1 (which are generally aligned with outer via layers 206-1, 214-1, 224-1, and 234-1). To help isolate a portion of the cavity region 242, an upper metallization layer 238 and lower metallization layer 210 are provided, which extend between barrier rings 244-1 and 244-2 through the cavity region 242. Additionally, metallization layers 210, 218-1, 218-2, 228-1, 228-2, and 238 are formed of an electrically conductive material (i.e., aluminum or copper). Finally, metallization layer 238 is generally surrounded by a dielectric layer 236 (which may be formed of silicon dioxide) and by protective overcoat 240 (i.e., dielectric stack).

Formed in the cavity region 242 (between the metallization layers 218 and 238) are circuit traces 220 and 230. These circuit traces 220 and 230 are generally formed at substantially the same time as and generally in parallel to metallization layers 218-1/218-2 and 228-1/228-2, respectively. Circuit traces 220 and 230 generally operate to provide an electrical connection between the functional area 112 and external electrical device (i.e., functional circuit 104). To accomplish this, there are opening 221 and 231 (which are generally aligned with one another) in metallization layers 218-1 and 228-1 (respectively) that allow circuit traces 220 and 230 to be electrically connected to an external electrical device, and there are openings 219 and 229 (which are generally aligned with one another) in metallization layers 218-2 and 228-2 (respectively) that allow for circuit traces 220 and 230 to be electrically connected to the electronic device of the functional area 112. Since openings 221/231 and 219/229 are respectively located in corners 108 and 110, which are effectively opposite corner, contaminant migration from the thermopile 102-1 through 102-4 through the cavity region 242 can be reduced due to the long path length. In addition the metallization layers 218 and 238 can be connected to the lowest electrical potential of the functional circuit which will prevent migration of ionic contaminant.

Thus, the combination of electrically conductive barrier rings 244-1 and 244-2 and the long migration path allow an electronic device (i.e., thermopile), where a protective overcoat 240 is penetrated during manufacture, to communicate with external devices while being isolated to prevent contamination.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an electronic device having an opening formed in a protective overcoat so as to form a cavity by etching in a substrate; and
   a sealing ring formed along the periphery of the electronic device, wherein the seal ring includes:
      a first barrier ring having a first set of electrically conductive layers formed between the substrate and the protective overcoat, wherein the first barrier ring includes a first opening at a first position;
      a second barrier ring having a second set of electrically conductive layers formed between the substrate and the protective overcoat, wherein the second barrier ring is generally parallel to the first barrier ring so as to form a cavity region therebetween, and wherein the first and second opening are separated from one another; and
      a circuit trace that is formed in the cavity region, wherein the circuit trace extends through the first opening so as to be electrically connected to the electronic device, and wherein the circuit trace extends through the second opening.

2. The apparatus of claim 1, wherein the first and second sets of electrically conductive layers further comprise:
a first metallization layer that forms at least one of the electrically conductive layers from the first set and at least one of the electrically conductive layers from the second set and that extend through the cavity region; and
a second metallization layer that forms at least one of the electrically conductive layers from the first set and at least one of the electrically conductive layers from the second set and that extend through the cavity region, wherein the circuit trace is located between the first and second metallization layers.

3. The apparatus of claim 2, wherein the circuit trace further comprises a plurality of circuit traces that each extent through the first and second openings.

4. The apparatus of claim 3, wherein the first and second sets of electrically conductive layers each further comprise a first via layer that is formed between the substrate and the first metallization layer.

5. The apparatus of claim 4, wherein the first and second sets of electrically conductive layers each further comprise a second via layer that is formed over the first metallization layer.

6. The apparatus of claim 5, wherein the first and second sets of electrically conductive layers each further comprise a third metallization layer that is formed over the second via layer and that is generally parallel to the first circuit trace.

7. The apparatus of claim 6, wherein the first and second sets of electrically conductive layers each further comprise a third via layer that is formed over the third metallization layer.

8. The apparatus of claim 7, wherein the first and second sets of electrically conductive layers each further comprise a fourth metallization layer that is formed over the third via layer and that is generally parallel to the second circuit trace.

9. The apparatus of claim 8, wherein the first and second sets of electrically conductive layers each further comprise a fourth via layer that is formed between the second and fourth metallization layers.

10. The apparatus of claim 9, wherein the electronic device further comprises a thermopile.

11. An apparatus comprising:
a functional circuitry;
a thermopile having an opening formed in a protective overcoat so as to form a cavity by etching in a substrate; and
a sealing ring formed along the periphery of the electronic device, wherein the seal ring includes:
a first barrier ring having a first set of electrically conductive layers formed between the substrate and the protective overcoat, wherein the first barrier ring includes a first opening at a first position;
a second barrier ring having a second set of electrically conductive layers formed between the substrate and the protective overcoat, wherein the second barrier ring is generally parallel to the first barrier ring so as to form a cavity region therebetween, and wherein the first and second opening are separated from one another; and
a circuit trace that is formed in the cavity region, wherein the circuit trace extends through the first opening so as to be electrically connected to the thermopile, and wherein the circuit trace extends through the second opening to be electrically connected to the functional circuitry.

12. The apparatus of claim 11, wherein the first and second sets of electrically conductive layers further comprise:
a first metallization layer that forms at least one of the electrically conductive layers from the first set and at least one of the electrically conductive layers from the second set and that extend through the cavity region; and
a second metallization layer that forms at least one of the electrically conductive layers from the first set and at least one of the electrically conductive layers from the second set and that extend through the cavity region, wherein the circuit trace is located between the first and second metallization layers.

13. The apparatus of claim 12, wherein the circuit trace further comprises a plurality of circuit traces that each extent through the first and second openings.

14. The apparatus of claim 13, wherein the first and second sets of electrically conductive layers each further comprise:
a first via layer that is formed between the substrate and the first metallization layer;
a second via layer that is formed over the first metallization layer;
a third metallization layer that is formed over the second via layer and that is generally parallel to the first circuit trace;
a third via layer that is formed over the third metallization layer;
a fourth metallization layer that is formed over the third via layer and that is generally parallel to the second circuit trace; and
a fourth via layer that is formed between the second and fourth metallization layers.

15. An apparatus comprising:
a thermopile having an opening formed in a protective overcoat so as to etch a cavity in a substrate; and
a sealing ring formed along the periphery of the electronic device, wherein the seal ring includes:
a first inner via layer formed over the substrate;
a first outer via layer formed over the substrate, wherein the first outer via layer is generally parallel to the first inner via layer;
a first metallization layer that is formed over the first inner and first outer via layers;
a second inner via layer formed over the first metallization layer, wherein the second inner via layer is generally aligned with the first inner via layer;
a second outer via layer formed over the first metallization layer, wherein the second outer via layer is generally aligned with the first output via layer;
a second metallization layer having an inner portion and an outer portion, wherein the inner portion of the second metallization layer is generally aligned with the second inner via layer, and wherein the outer portion of the second metallization layer is generally aligned with the second outer via layer, and wherein the inner portion of the second metallization layer includes a first opening at a first position, and wherein the outer portion of the second metallization layer includes a second opening at a second portion, and wherein the first and second positions are separated from one another;
a first circuit trace formed between the inner and outer portions of the second metallization layer, wherein the first circuit trace extends through the first opening so as to be electrically connected with the thermopile, and wherein the first circuit trace extends through the second opening;
a third inner via layer formed over the inner portion of the second metallization layer;

a third outer via layer formed over the outer portion of the second metallization layer;

a third metallization layer having an inner portion and an outer portion, wherein the inner portion of the third metallization layer is generally aligned with the third inner via layer, and wherein the outer portion of the third metallization layer is generally aligned with the third outer via layer, and wherein the inner portion of the third metallization layer includes a third opening at a third position, and wherein the outer portion of the third metallization layer includes a fourth opening at a fourth portion, and wherein the third and fourth positions are separated from one another;

a second circuit trace formed between the inner and outer portions of the third metallization layer, wherein the second circuit trace extends through the third opening so as to be electrically connected with the thermopile, and wherein the second circuit trace extends through the fourth opening;

a fourth inner via layer formed over the inner portion of the third metallization layer;

a fourth outer via layer formed over the outer portion of the third metallization layer; and a fourth metallization layer that is formed over the fourth inner and fourth outer via layers.

16. The apparatus of claim 15, wherein the first and second positions are located opposite one another along the periphery of the thermopile.

17. The apparatus of claim 16, wherein the first opening is generally aligned with the third opening, and wherein the second opening is generally aligned with the fourth opening.

* * * * *